United States Patent [19]
Katto et al.

[11] Patent Number: 4,830,977
[45] Date of Patent: May 16, 1989

[54] METHOD OF MAKING A SEMICONDUCTOR MEMORY DEVICE

[75] Inventors: Hisao Katto, Tokyo; June Sugiura, Musashino; Nozomi Horino, Higashiyamato; Akira Endo, Hachiouji; Yoshiharu Takeuchi, Koganei; Yuji Arakawa, Kokubunji, all of Japan

[73] Assignee: Hitachi, Ltd., Tokyo, Japan

[21] Appl. No.: 148,956

[22] Filed: Jan. 27, 1988

Related U.S. Application Data

[62] Division of Ser. No. 704,572, Feb. 22, 1985, Pat. No. 4,731,642.

[30] Foreign Application Priority Data

Feb. 24, 1984 [JP] Japan ................... 59-32444

[51] Int. Cl.$^4$ ........................... H01L 21/70
[52] U.S. Cl. ...................... 437/52; 437/48; 437/51; 437/61; 437/187; 437/229
[58] Field of Search ............ 437/50, 51, 52, 60, 437/919, 186, 229, 61, 187; 357/23.6, 40; 365/189

[56] References Cited

U.S. PATENT DOCUMENTS

| | | | |
|---|---|---|---|
| 4,449,207 | 5/1984 | Kung et al. | 365/189 |
| 4,685,089 | 8/1987 | Patel et al. | 365/189 |
| 4,713,678 | 12/1987 | Womack et al. | 357/23.4 |

FOREIGN PATENT DOCUMENTS 0193454 8/1986 Japan .

Primary Examiner—Brian E. Hearn
Assistant Examiner—Tom Thomas
Attorney, Agent, or Firm—Antonelli, Terry & Wands

[57] ABSTRACT

A semiconductor memory device having wiring formed next to word lines at the extreme ends of the memory cell arrays or next to word lines of the dummy cell arrays, in order to prevent such word lines from breaking or from becoming deformed. The wiring is irrelevant to the circuit operation, but is provided with a fixed potential, and is formed through the steps of forming the word lines. The wiring makes the processing conditions applied to the neighboring word lines the same as the processing conditions applied to other word lines.

5 Claims, 5 Drawing Sheets

METHOD OF MAKING A SEMICONDUCTOR MEMORY DEVICE

This is a divisional of application Ser. No. 704,572, filed Feb. 22, 1985, now U.S. Pat. No. 4,731,642.

BACKGROUND OF THE INVENTION

The present invention relates to a semiconductor memory device, and particularly to an arrangement that can be effectively adapted to semiconductor memory devices of a highly integrated form.

Semiconductor memory devices have memory cell arrays in which a plurality of memory cells are arranged in the form of a matrix on a semiconductor chip. In the memory cell arrays are formed a plurality of word lines that extend in one direction. On the word lines are formed a plurality of data lines with an intermediate insulating film therebetween, the data lines extending in a direction at right angles with the word lines.

Accompanying the progress toward a high degree of integration, word lines and data lines have become finer. For instance, in a dynamic RAM (random access memory) of 256 K bits, the pattern width is about 2 $\mu$m.

However, the yield decreases as the patterns become finer. Therefore, a so-called redundancy configuration has been employed to replace a failed or a malfunctioning bit, row or column with a spare element.

According to the study conducted by the inventors of the present invention, the portions that are replaced most frequently are word lines at the ends of the memory cell arrays.

The inventors attribute the cause to the following reasons.

The word lines are coated with an intermediate insulating film consisting of a phosphosilicate glass or the like, and data lines are formed thereon. Contact holes are formed in the intermediate insulating film prior to forming the data lines.

The thickness of a resist film for forming the contact holes is limited to, for example, about 1 $\mu$m from the standpoint of precision for forming patterns of contact holes. Since the resist film is in a fluid state for such processing as spin coating and backing, the resist film thickness is less on protruded portions than in recessed portions. Therefore, the resist film is thinner on the word lines formed on the electrode layers of capacitors formed on a thick field oxide film than on other portions.

In particular, the resist film is thinnest at portions of word lines located at the ends of memory cell arrays. Since no word line exists on one side of these word lines, it is considered that the resist film tends to flow toward the direction where no word line exists. The thickness of the resist film varies depending upon the underlying pattern.

To form fine contact holes, dry etching is employed. Further, over-etching is performed so that the surface of the substrate is completely exposed.

The resist film is etched during dry etching by several thousands of angstroms overall. In the portions where the resist film is thin, in particular, the resist film is removed and the underlying intermediate insulating film is exposed. The intermediate insulating film which is exposed is easily etched. Therefore, the word lines under the intermediate insulating film are subjected to etching, causing defects such as line breakage.

Word line breakage develops locally in the portions where the resist film is particularly thin.

This defect develops not only in the word lines at the ends of the memory cell arrays but also in the dummy cell-selecting word lines in the dummy cell arrays.

OBJECTS OF THE INVENTION

An object of the present invention is to provide a technique which effectively solves the problem associated with the processing of resist in producing semiconductor memory devices of a highly integrated form.

Another object of the present invention is to prevent word lines from breaking in the semiconductor memory devices of a highly integrated form.

The above and other objects as well as novel features of the present invention will become obvious from the description of the specification and the accompanying drawings.

SUMMARY OF THE INVENTION

A representative example of the invention disclosed in the present application is described below briefly.

Additional word lines that do not participate in the operation of a memory circuit are arranged on the outside of the word lines that are located at the ends of the memory array. The additional word lines work to prevent the photoresist from flowing. Therefore, the photoresist film covering the word lines which are located at the ends is allowed to have nearly the same thickness as that covering the neighboring word lines and that covering other word lines. Additional word lines can be formed simultaneously with the formation of the other word lines, without requiring any additional steps.

DESCRIPTION OF THE PREFERRED EMBODIMENT

Described below is an embodiment in which the present invention is adapted to a dynamic RAM.

Figure 1:
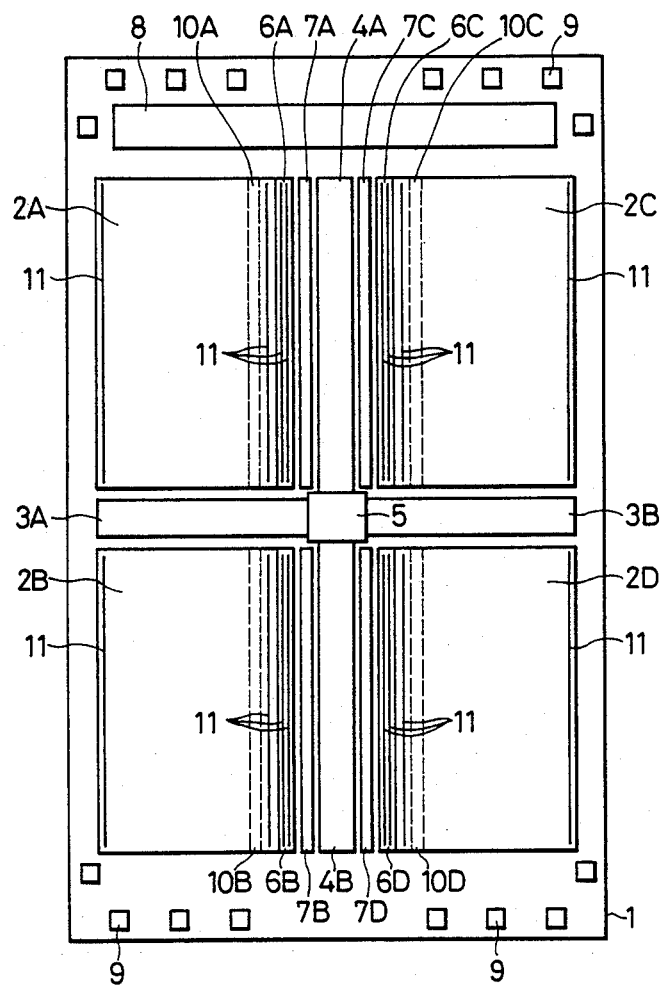
FIG. 1 is a plan view showing a chip layout of a dynamic RAM to which the present invention is adapted for purposes of illustration.

FIG. 1 is a diagram showing a chip layout pattern of the dynamic RAM. Four memory cell arrays are formed on a silicon chip 1 which is a semiconductor chip, the memory cell arrays 2A, 2B, 2C and 2D being separated from each other in the chip 1. Among the memory cell arrays 2A to 2D are arranged X-decoders 3A, 3B and Y-decoders 4A, 4B, and at a crossing point thereof is arranged a column/row switching circuit 5. The memory cell arrays 2A to 2D contain redundancy circuits 10A, 10B, 10C and 10D that correspond to four word lines on the side portions of the Y-decoders. Dummy cell arrays 6A, 6B, 6C and 6D, as well as sense amplifiers 7A, 7B, 7C and 7D are arranged among the memory arrays and the Y-decoders. Further, around the periphery of the chip 1 are arranged bonding pads 9 and peripheral circuits 8 that include input/output buffers, and signal generator circuits. It should be noted that the dummy cell arrays operate in a well-known manner to provide a reference voltage level smaller than the output voltage of the memory cell array corresponding to a high level output. This reference voltage level is used, in conjunction with the sense amplifiers to establish the presence of a high or low voltage output from the memory cell array, in a well-known manner.

The aforementioned additional word lines 11 for preventing the thickness of the photoresist film from decreasing are arranged at the ends of memory cell arrays close to the scribe lines, at the ends of memory cell arrays on the side of redundancy circuits 10, and in the dummy cell arrays 6.

The additional word lines in the memory cell arrays will first be described below in conjunction with FIG. 2 which illustrates on an enlarged scale a portion of the memory cell array 2A. For easy comprehension of the drawings, the insulating film among the conductor layers and the final protective film are not shown.

Figure 2:
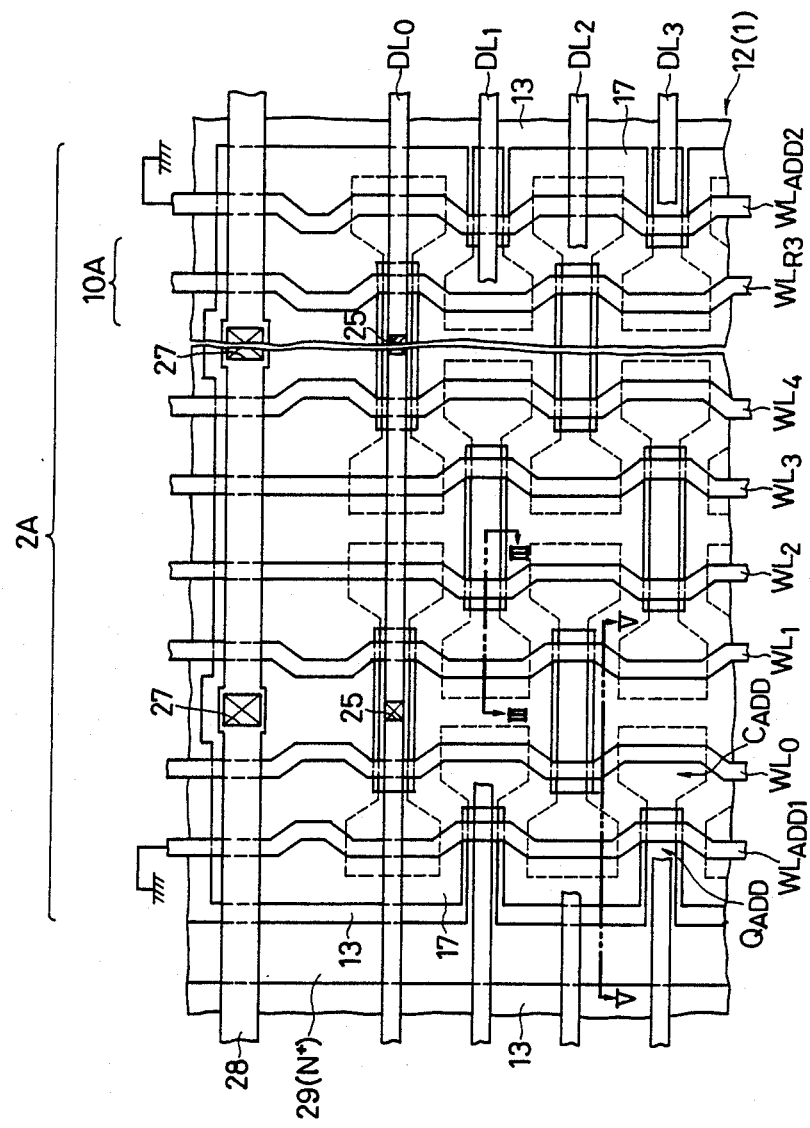
FIG. 2 is a plan view showing a portion of a memory cell array of the dynamic RAM of FIG. 1.

As will be understood from FIG. 2, a number of memory cells in the form of a matrix are arranged in the memory cell array 2A. The same also holds true for other memory cell arrays 2B, 2C and 2D. Therefore, word lines $WL_0$ to $WL_4$ extend in parallel with each other on the memory cell array. On the word lines, data lines $DL_0$ to $DL_3$, ... extend parallel to each other and at right angles to the word lines. For easy comprehension of the drawing, the data lines are shown only partially.

Figure 3:
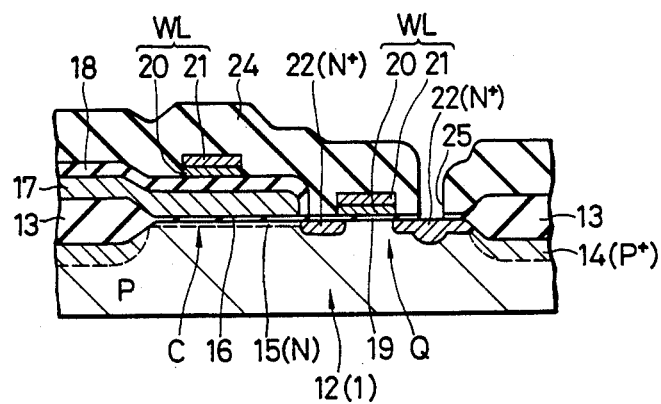
FIGS. 3 and 4 are a section view along the line III—III of FIG. 2, to illustrate the structure of a memory cell in the dynamic RAM, and a circuit diagram, respectively.
Figure 4:
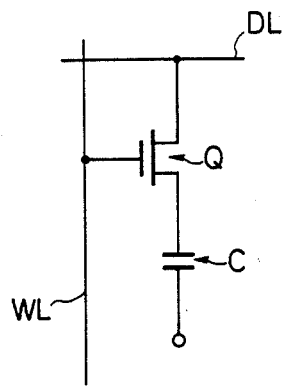

Memory cells are arranged at intersecting points of the word lines $WL_0$ to $WL_4$, ... and data lines $DL_0$ to $DL_3$, ... FIG. 3 shows the srructure of a memory cell, and FIG. 4 is a circuit diagram of the memory cell. FIG. 3 is a section view along the line III—III of FIG. 2.

Each memory cell of the dynamic RAM comprises, as shown in FIG. 4, a MISFET Q and a capacitor C for storing data that is connected to the MISFET Q.

The MISFET Q comprises n+-type semiconductor regions 22 that serve as the source and drain regions, a thin silicon dioxide film 19 that serves as a gate insulating film, and a gate electrode which is a portion of a word line WL made up of polycrystalline silicon 20 and molybdenum silicide 21, that are all formed in the surface of a semiconductor substrate 12 (semiconductor chip 1) composed of a p-type single crystalline silicon.

A capacitor C comprises an n-type semiconductor region 15 that serves as an electrode, a thin insulating film 16 that serves as a dielectric layer, and a first polycrystalline silicon layer 17 which is formed on the insulating film 16 and which serves as another electrode, that are all formed in the surface of the semiconductor substrate 12. Reference numeral 25 denotes a contact hole. The data lines (not shown) on the intermediate insulating film 24 are electrically connected to the n+-type semiconductor region 22 via the contact holes 25.

In FIG. 3, reference numeral 13 denotes a field insulating film which is formed by selectively and thermally oxidizing the semiconductor substrate 12. A p+-type channel stopper 14 is formed under the field insulating film 13. Reference numeral 18 denotes an intermediate insulating film which is formed by oxidizing the surface of the polycrystalline silicon layer 17.

In FIG. 2, aluminum wiring 28 supplies a power-source voltage $V_{CC}$ (5 volts) to the polycrystalline silicon layer 17 which serves as one electrode of the capacitor C. Wiring 28 is formed simultaneously with the data lines and extends in the same direction as the data lines. Wiring 28 is electrically connected to the polycrystalline silicon layer 17 through contact holes 27.

When another fixed potential such as potential (0 volts) is to be supplied to the polycrystalline silicon layer 17, a potential of 0 volts is applied to wiring 28.

The left side of the memory cell array 2A adjoins a guard ring region 29 which comprises an n+-type semiconductor region and which is formed so as to surround the outer periphery of the memory cell arrays 2A, 2B, 2C and 2D, so that the memory cells will not be affected by the minority carriers.

The word lines $WL_0$ to $WL_4$... extend downward in FIG. 2, and are connected to the X-decoder 3A. Each word line is served with a low level or high level signal via the X-decoder to select a memory cell.

The data lines $DL_0$ to $DL_3$, ... extend to the right in FIG. 2, and are connected to the dummy cell array 6A, sense amplifier 7A, and Y-decoder 4A.

An additional word line $WL_{ADD1}$ (11) is formed at an end of the memory cell array 2A, i.e., on the outside of the word line $WL_0$ of the extreme end. The additional word line $WL_{ADD1}$ is formed simultaneously with the formation of word lines $WL_0$ to $WL_4$, ... The additional word line $WL_{ADD1}$ prevents the word line $WL_0$ from being broken or deformed at the time of forming the contact holes 25. In other words, the additional word line prevents the resist film for forming contact holes 25 from becoming thin on the word line $WL_0$.

Figure 5:
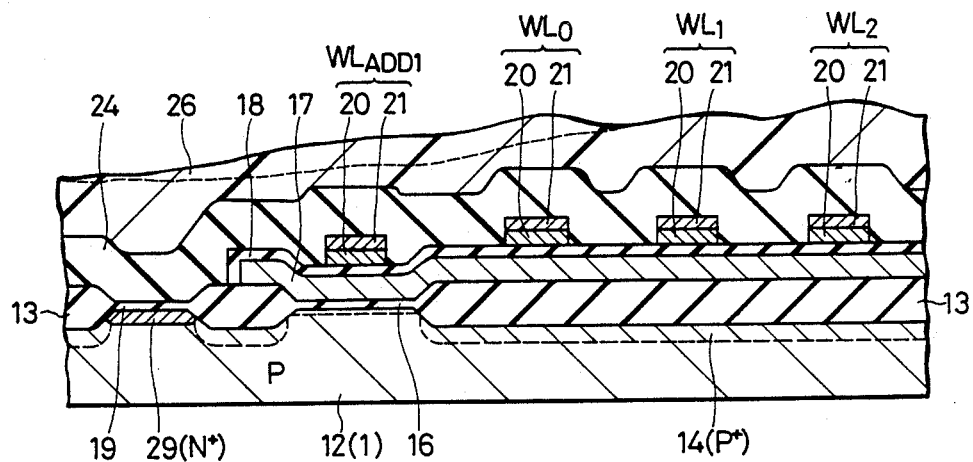
FIG. 5 is a section view along the line V—V of FIG. 2, illustrating the formation of resist film at an end of the memory cell array.

FIG. 5 shows the shape of the resist film 26 for forming contact holes. FIG. 5 is a section view along the line V—V of FIG. 2 taken at a time which is just after the resist film 26 is applied. Since the additional word line $WL_{ADD1}$ prevents the resist film 26 from flowing to the left in FIG. 5, the resist film 26 is allowed to have a thickness on the word line $WL_0$ that is the same as that of the resist film 26 on other word lines. When the contact holes 25 are to be formed, therefore, the resist film 26 works sufficiently as a mask for dry etching even on the word line $WL_0$.

When the additional word line $WL_{ADD1}$ is not formed, the resist film 26 assumes the shape as indicated by the dotted line in FIG. 5. In this case, the resist film 26 has a thickness on the word line $WL_0$ which is about one-third the thickness of the resist film on other word lines.

As mentioned earlier, thickness of the resist film varies depending upon the underlying pattern. Formation of the additional word line $WL_{ADD1}$ makes the pattern condition around the word line $WL_0$ at the extreme end nearly the same as the pattern condition around other word lines. This helps prevent the word line $WL_0$ from breaking or from being deformed.

Another additional word line $WL_{ADD2}$ has also been formed at an end of the memory cell array 2A on the side of the Y-decoder 4A. Like the abovementioned additional word lines $WL_{ADD1}$, the additional word line $WL_{ADD2}$ helps prevent the neighboring word line $WL_{R3}$ in the memory cell array 2A from breaking or from being deformed.

The word line $WL_{R3}$ is a part of the redundancy circuit 10A which is formed contiguous to the memory cells in the memory cell array 2A. The redundancy circuit 10A has four spare rows (redundancy rows), each spare row being provided with a word line and a memory cell connected to the word line. Among four word lines of the redundancy circuit 10A, the word line $WL_{R3}$ is located on the side closest to the Y-decoder. This condition is nearly the same as that of the word line $WL_0$.

By preventing the word line $WL_{R3}$ from breaking or from being deformed, the redundancy circuit 10A can be effectively utilized, and reliability of the semiconductor memory device can be increased. The redundancy circuit which is to substitute for defective memory cells has fewer defects, and the substitution can be effected reliably and efficiently.

A fixed potential is preferably applied to the additional word lines $WL_{ADD1}$ and $WL_{ADD2}$. The additional word lines are quite irrelevant to such operations as writing or reading the memory cells or storing the data. It is, however, desired to prevent the additional word lines from floating as far as this is possible. As shown in FIG. 2, therefore, the additional word lines $WL_{ADD1}$ and $WL_{ADD2}$ have been connected to ground potential (0 volts).

Another fixed potential, such as the potential which is applied to the polycrystalline silicon layer 17, may be applied to the additional word lines, if desired.

Owing to the provision of additional word lines, there is formed as shown in FIG. 2 a MISFET $Q_{ADD}$ which has one terminal connected to a capacitor $C_{ADD}$ having the structure which is the same as that of the capacitor C of a memory cell. No matter what potential the additional word lines $WL_{ADD}$ may assume, one terminal of the capacitor $C_{ADD}$ must be electrically connected to the guard ring 29. The minority carriers must be discharged into the guard ring 29, so that minority carriers trapped in the n-type region 15 of the capacitor $C_{ADD}$ will not adversely affect the capacitor of the neighboring memory cell.

Therefore, an n-type region is formed in the channel region of MISFET $Q_{ADD}$ simultaneously with the formation of the n-type region 15. Arsenic ions that serve as n-type impurities should be implanted through the silicon oxide film 16. In the step of ion implantation, a silicon oxide film 16 is formed on the channel region of the MISFET $Q_{ADD}$.

Although not specifically shown in FIG. 2, it is noted that n-type regions are also formed in the portions where the word lines $WL_0$, to $WL_4$, . . . , $WL_R$, $WL_{ADD}$, . . . traverse the guard ring 29.

Additional word lines $WL_{ADD}$ (11) are also formed in other memory cell arrays 2B, 2C and 2D, as shown in FIG. 1.

Figure 6:
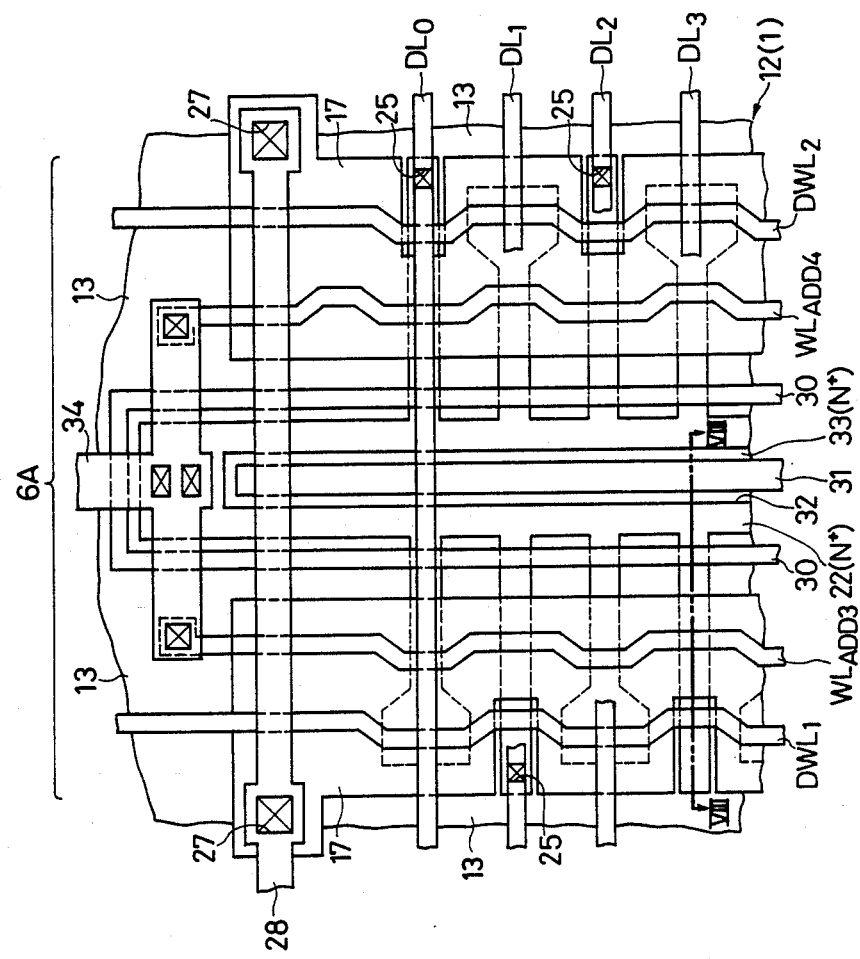
FIG. 6 is a plan view showing a portion of a dummy cell array in the dynamic RAM of FIG. 1.

Additional word lines $WL_{ADD3}$ and $WL_{ADD4}$ are formed in a dummy cell array 6A as shown in FIG. 6 which is a diagram to illustrate on an enlarged scale a portion of the dummy cell array 6A. For easy comprehension of the drawing, the insulating film among the conductors and the final protective film are not shown.

In FIG. 6, dummy cells are arranged in two rows in the dummy cell array 6A. Data lines $DL_0$ to $DL_3$, . . . shown in FIG. 2 extend on the dummy cell array 6A, and a dummy cell is provided for each of the data lines. A word line DWL for selecting a dummy cell and a wiring 30 that serves as a gate electrode of MISFET $Q_{DC}$ are formed in a direction to meet the data lines at right angles therewith.

Figure 7:
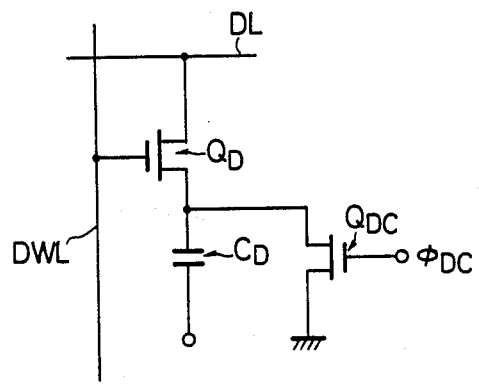
FIGS. 7 and 8 are a circuit diagram of a dummy cell in the dynamic RAM, and a section view along the line VIII—VIII of FIG. 6, showing the structure of the dummy cell.

As shown in FIG. 7, the dummy cell comprises a MISFET $Q_D$, a capacitor $C_D$, and a MISFET $Q_{DC}$ for discharging the electric charge stored in the capacitor $C_D$.

Figure 8:
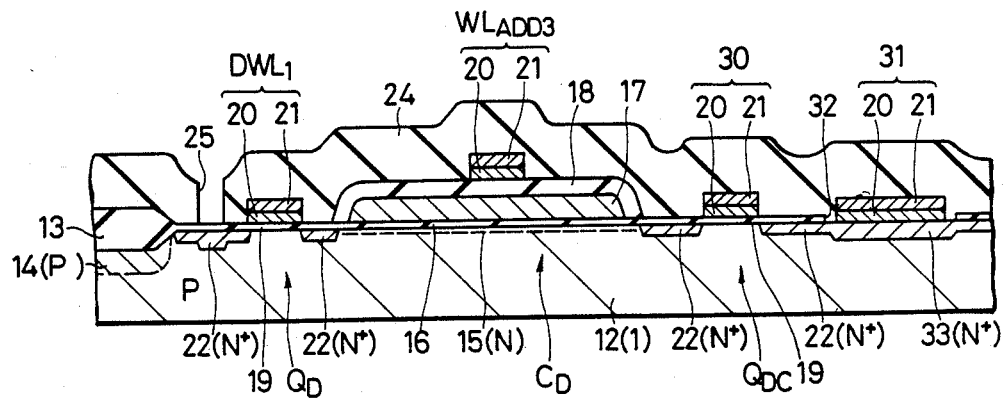

The MISFET's $Q_D$ and $Q_{DC}$ are formed through the steps for forming the MISFET's Q of memory cells, and the capacitor $C_D$ is formed through the steps for forming the capacitors C of memory cells. Therefore, there is obtained a dummy cell of the structure which is shown in FIG. 8.

An $n^+$-type semiconductor region 33 is used as wiring to supply ground potential (0 volts) to the MISFET $Q_{DC}$. Wiring 31 contacts semiconductor region 33 via a contact hole 32 and works to reduce the resistance thereof. Semiconductor region 33 is served with ground potential via aluminum wiring 34.

Wiring 28 is connected via contact hole 27 to the polycrystalline silicon layer 17 which serves as one electrode of capacitor $C_D$.

The additional word line $WL_{ADD3}$ is formed between the word line DWL and wiring 30 extending nearly in parallel therewith. The additional word line $WL_{ADD3}$ works chiefly to prevent the word line $DWL_1$ from breaking or from becoming deformed. The additional word line $WL_{ADD4}$ is also provided for the same reason. By forming the additional word lines $WL_{ADD3}$ and $WL_{ADD4}$, the thickness of the resist film on the word lines $DWL_1$ and $DWL_2$ can be maintained for forming contact holes 25.

Ground potential (0 volts) is applied to the additional word lines $WL_{ADD3}$ and $WL_{ADD4}$ via aluminum wiring 34. As mentioned earlier, other fixed potentials may be applied to the additional word lines.

According to the present invention, additional word lines which are irrelevant to the operation of the memory circuit are arranged on the outside of the word lines that are located at the extreme ends among the word lines in a semiconductor memory device. The additional word lines work to prevent the resist film from flowing, and the thickness of the resist film on the word lines located at the extreme ends is prevented from being reduced. This makes it possible to effectively solve the problem of breakage in the word line that stems from the decrease in the thickness of resist film.

Additional word lines can be formed through the steps of forming the other word lines; hence, no additional step is required to form the additional word lines.

In the foregoing was concretely described the invention accomplished by the inventors of the present invention by way of an embodiment. It should, however, be noted that the present invention is in no way limited to the above-mentioned embodiment only, but can be modified in a variety of other ways without departing from the spirit and scope of the invention.

For instance, if space permits, not only one additional word line but also a plurality of additional word lines can be provided.

The additional word lines should ideally be constructed in the same manner as the other word lines, and should also be made of the same material as the other word lines. Therefore, the additional word lines may be formed by using, for example, a polycrystalline silicon film, a high-melting point metal film (such as molybdenum, titanium, tantalum, tungsten), or a silicide film of high-melting point metal.

The present invention is not limited to four arrays, and can further be adapted to a semiconductor memory device which has two or eight memory cell arrays (or some other number).

Although the foregoing description has chiefly dealt with the case where the invention accomplished by the inventors of the present invention was adapted to a dynamic RAM that served as background of the invention, it should be noted that the invention is in no way limited only to this.

The invention can be adapted not only to a dynamic RAM but also to any other semiconductor memory device. The invention can be extensively adapted to semiconductor memory devices having memory cell arrays that consist of a plurality of memory cells.

The present invention is effective for semiconductor devices in which word lines are formed by a second conductor layer that is formed on a semiconductor substrate. The invention is particularly effective for EPROM's in which the word lines are formed on the floating gates. The additional word lines should preferably have the same shape as that of other word lines. Therefore, the floating gate should also be formed under the additional word lines.

We claim:

1. A method of forming a semiconductor device which includes at least one memory cell array having a plurality of memory cells that are formed in rows and in columns on a semiconductor substrate, a plurality of data lines formed in columns, said data lines being coupled to said memory cells that are arrayed in corresponding columns, a plurality of word lines formed in rows, said word lines being coupled to said memory cells that are arrayed in corresponding rows, and a film that is formed to extend in the same direction as said plurality of word lines formed in rows and located between said plurality of word lines and at least one peripheral edge of said memory cell array, said film being composed of the same material as said word lines, said method comprising:
    forming a photoresist layer over said plurality of word lines and said film after the formation of the word lines and the film; and
    forming contact holes using said photoresist layer as a mask by dry etching in an intermediate film formed between the word lines and the data lines to coupled the data lines to the memory cells,
    wherein said film is located on said substrate at a location to prevent the thickness of the resist film from decreasing on the word lines which are located closest to said peripheral edge, and
    wherein said data lines are comprised of aluminum, and wherein said word lines and said film are each comprised of a first layer of polycrystalline silicon and a second layer of silicide formed over said first layer.

2. A method of forming a semiconductor device according to claim 1, wherein said film is coupled to a fixed potential.

3. A method of forming a semiconductor device according to claim 2, wherein said film is arranged to have no participation in the operation of said memory cell array.

4. A method of forming a semiconductor device according to claim 1, wherein the distance between said film and the word line immediately adjacent thereto is the same as the distance between said word lines.

5. A method of forming a semiconductor device according to claim 1, wherein said word lines and said film are formed simultaneously with one another.

* * * * *